(12) United States Patent  
Okada

(10) Patent No.: US 6,424,036 B1  
(45) Date of Patent: Jul. 23, 2002

(54) SEMICONDUCTOR DEVICE AND METHOD FOR MANUFACTURING THE SAME

(75) Inventor: Norio Okada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/398,161

(22) Filed: Sep. 16, 1999

(30) Foreign Application Priority Data

Sep. 17, 1998 (JP) .............................................. 10-263663

(51) Int. Cl.$^7$ .............................................. H01L 23/48
(52) U.S. Cl. ........................ 257/734; 257/737; 257/741; 257/743; 257/762; 257/765; 257/766; 257/508; 438/411; 438/687; 438/688
(58) Field of Search ............................... 257/734, 737, 257/741, 743, 762, 765, 766

(56) References Cited

U.S. PATENT DOCUMENTS

| | | | | |
|---|---|---|---|---|
| 5,225,711 A | * | 7/1993 | Chang et al. ............... 257/750 |
| 5,272,376 A | * | 12/1993 | Ueno ........................ 257/737 |
| 5,457,345 A | * | 10/1995 | Cook et al. ................ 257/766 |
| 5,629,564 A | * | 5/1997 | Nye, III et al. ............. 257/762 |
| 5,656,858 A | * | 8/1997 | Kondo et al. ............... 257/737 |
| 5,668,405 A | * | 9/1997 | Yamashita .................. 257/668 |
| 5,889,326 A | * | 3/1999 | Tanaka ...................... 257/737 |
| 5,943,597 A | * | 8/1999 | Kleffner et al. ............. 438/613 |
| 6,027,999 A | * | 2/2000 | Wong ........................ 438/637 |
| 6,075,290 A | * | 6/2000 | Schaefer et al. ............ 257/737 |
| 6,204,566 B1 | * | 3/2001 | Shinomiya .................. 257/787 |

FOREIGN PATENT DOCUMENTS

| | | |
|---|---|---|
| JP | 6-252147 | 9/1994 |
| JP | 8-213401 | 8/1996 |

* cited by examiner

*Primary Examiner*—Eddie Lee  
*Assistant Examiner*—Edgardo Ortiz  
(74) *Attorney, Agent, or Firm*—Hutchins, Wheeler & Dittmar

(57) ABSTRACT

A pad metal film used to fit a conductor for external connection composed of a bump-like or wire-like conductor can be formed by reduced numbers of processes. A semiconductor device is so configured that a trench for interconnect with its diameter of about 50 $\mu$m and its depth of about 2 $\mu$m is formed on a protective insulating film, formed on a semiconductor substrate, with a thickness of 3 to 4 $\mu$m, and in the trench for interconnect is imbedded an uppermost-layered copper wiring through a first barrier metal film composed of a titanium nitride with a thickness of about 50 nm. Furthermore, approximately in the center region of the upper-layered copper wiring is imbedded a copper pad film through a second barrier metal film with a thickness of about 70 nm.

14 Claims, 14 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same and more particularly to a semiconductor device provided with a pad metal film to which a conductor for external connection to be connected to external wiring formed on a printed circuit board is fitted and wherein the pad metal film is covered, except a face for fitting the conductor for external connection, with a final protective insulating film.

2. Description of the Related Art

As the integration of an LSI (Large Scale Integrated Circuit) used for a microprocessor or memory, known as a typical semiconductor device increases, each region of such semiconductors constituting the LSI is being scaled down dimensionally. In wiring processes for each region of the semiconductor, an interconnection hole including a contact hole or via hole formed on an insulating film and a trench for interconnection into which wiring is imbedded are dimensionally scaled down as well. In response to higher wiring density, multi-level interconnect technology by which the wiring is multi-layered in the direction of a thickness of a semiconductor substrate is developing. In the updated LSI, a multi-level interconnect (for example, 5 to 7 levels) has been incorporated. In such LSIs, if used for a high-speed microprocessor in particular, a resistance value of wiring presents a problem in terms of operations. Wiring having less resistance is desired accordingly. Conventionally, as a material for wiring in semiconductor devices including LSIs, aluminum or aluminum metal composed mainly of aluminum being excellent in electric characteristics, processabilities and the like. However, aluminum metals have a shortcoming of being less resistant to electromigration and to stress migration. Because of this, there is a tendency that copper or copper metals composed mainly of copper, which is of less resistance compared with aluminum and is excellent in resistance against electromigration and stress migration, are used instead of aluminum.

FIG. 9 is a cross-sectional view showing a conventional semiconductor device (hereafter referred to as a first conventional example). In the conventional semiconductor substrate 65 in FIG. 9, a trench for interconnect 53 is formed in a protective insulating film 52 formed on a semiconductor substrate 51 and on the trench for interconnect is formed a uppermost-layered copper wiring 55 through a first barrier metal film 54 composed of a titanium nitride film or the like. The protective insulating film 52 is covered with a final protective insulating film 56 and in the final protective insulating film 56 is formed a contact hole 57 with an approximately central part of the uppermost-layered copper wiring 55 exposed. In this contact hole 57 is formed a second barrier metal film 58 composed of stacked layers containing, for example, a titanium nitride film, a nickel film and a gold film and through this second barrier metal film 58 is formed a copper pad metal film 59. To this copper pad metal film 59 is fitted a bump-like conductor 60 composed of solder.

The first barrier metal film 54 is used to prevent adverse effects on the lower-layered wiring or diffused region caused by diffusion of the uppermost-layered copper wiring 55 into the protective insulating film 52. Moreover, the second barrier metal film 58 is used to prevent the inconvenience of copper suctioning or the like caused by an action of solder components of the bump-like conductor 60.

As shown in FIG. 16, a semiconductor device 65 is mounted, by a flip chip method (face-down bonding), on an external wiring 62 fitted to a printed circuit board 61 through a bump-like conductor 60 to be served as a conductor for external connection which is connected to the uppermost-layered copper wiring 55.

Referring to FIGS. 10A, 10B, 10C, 11A, 11B, 11A and 12B, a method for manufacturing the first conventional example of the semiconductor device is described hereinafter in order of processes.

First, as shown in FIG. 10A, a trench for interconnect 53 is formed on a protective insulating film 52 mounted on a semiconductor substrate 51 by using lithography technology. Next, as shown in FIG. 10B, on the protection insulating film 52 containing the trench for interconnect 53 are sequentially formed the first barrier metal film 54 and uppermost-layered copper wiring film 55A by using a sputtering method or the like.

Next, as shown in FIG. 10C, by removing both the first barrier metal film 54 and the uppermost-layered copper wiring film 55 from the upper face of both the protective insulating film 52 and the trench for interconnect 53 using a CMP (Chemical Mechanical Polishing) method, the protective insulating film 52 is planarized in order to form the uppermost-layered copper wiring 55.

Next, as shown in FIG. 11A, after the formation of a final protective insulating film 56 on the protective insulating film 52, a resist film 63 is formed. Then, as depicted in FIG. 11B, by using the resist film 63 as a mask, etching on the final protective insulating film 56 is performed to provide the contact hole 57. Next, as shown in FIG. 12A, after the sequential formation of the second barrier metal film 58 and copper pad metal film 59, a resist film 64 is formed. Furthermore, as shown in FIG. 12B, using the resist film 64 as a mask, patterning of the second barrier metal film 58 and the copper pad metal film 59 to a desired shape are performed. Then, by using a plating method, a bump-like conductor 60 composed of solder is fitted to the pad metal film 59 to produce a semiconductor device shown in FIG. 9.

FIG. 13 is a cross-sectional view showing a conventional semiconductor device (hereinafter referred to as a second conventional example). As shown in FIG. 13, in a semiconductor device 70, an aluminum pad metal film 66 is formed, through the second barrier metal film 58, on the first barrier metal film 54 and uppermost-layered copper wiring 55. To the aluminum pad metal film 66 is fitted a wire-like conductor 67 composed of aluminum. In this example, the second barrier metal film 58 serves to prevent a reaction between the uppermost-layered copper wiring 55 and the aluminum pad metal film 66. The same reference numbers in FIG. 13 designate corresponding parts shown in FIG. 9 and the description is omitted The semiconductor device 70, as shown in FIG. 17, is fixed, by face-up bonding, on a printed circuit board 61 using an adhesive agent and is then mounted on an external wiring 62 through a wire-like conductor 67 used as a conductor for external connection.

By referring to FIGS. 14A, 14B, 15A and 15B, a method for manufacturing a second conventional example of semiconductor devices.

First, as shown in FIG. 14A, after the second barrier metal film 58 and the aluminum pad metal film 66 obtained in FIG. 10C are formed on a protective insulating film 52, the first barrier metal film 54 and the uppermost-layered copper wiring 55, a resist film 68 is formed. Next, as shown in FIG. 14B, using the resist film 68 as a mask, patterning of the second barrier metal film 58 and aluminum pad metal film 66 to a desired shape is performed.

Next, as depicted in FIG. 15A, after the formation of the final protective insulating film 56 on the protective insulating film 52 and aluminum pad metal film 66, a resist film 69 is formed. Then, as shown in FIG. 15B, using the resist film 69 as a mask, patterning of the final protective insulating film 56 to a desired shape is performed to make the aluminum pad metal film 66 exposed. Then, by using a wire bonding method, a wire-like conductor 67 composed of aluminum is fitted to the aluminum pad metal film 66 to produce the semiconductor device shown in FIG. 9.

In the conventional first and second examples of the semiconductor devices, there is a problem in that they require many numbers of processes to produce them.

That is, in the first conventional example, the trench for interconnect 53 is, in advance, formed on the protective insulating film 52 and the uppermost-layered copper wiring 55 is formed through the first barrier metal film 54. Then, the final protective insulating film 56 is formed to provide the contact hole 57. Furthermore, after the formation of the second barrier metal film 58 and the pad metal film 59, patterning of the pad metal film 59 is performed. Accordingly, many numbers of processes are required to obtain the pad metal film 59.

Furthermore, in the second conventional example as in the first conventional one, the trench for interconnect 53 is formed, in advance, on the protective insulating film 52 and the uppermost-layered copper wiring 55 is formed through the first barrier metal film 54. Then, after the formation of the second barrier metal film 58 and aluminum pad metal film 66, the patterning of the aluminum pad metal film is performed. Accordingly, the increase in numbers of processes is unavoidable.

SUMMARY OF THE INVENTION

In view of the above, it is an object of the present invention to provide a semiconductor device and a method for manufacturing the same wherein an uppermost-layered copper wiring has barrier metal films both at an interface with a pad metal film and at an interface with backing insulating film and wherein the pad metal film used to fit a conductor for external connection, composed of a bump-like or wire-like conductor, can be formed by reduced numbers of processes.

According to a first aspect of the present invention, there is provided a semiconductor device comprising a pad metal film to which a conductor for external connection to be connected to an external wiring formed on printed circuit boards is fitted and which is covered, except a face for fitting the conductor for external connection, with a final protective insulating film and which is connected to the uppermost-layered wiring;

whereby the uppermost-layered wiring being provided with the pad metal film through a second barrier metal film and with the first barrier metal film at an opposite face to the pad metal film.

In the foregoing, a preferable mode is one wherein the protective insulating film is formed below the final protective insulating film and on the protective insulating film are formed, from the bottom, the first barrier metal film, the uppermost-layered wiring film, the second barrier metal film and the pad metal film.

According to a second aspect of the present invention, there is provided a semiconductor device comprising a pad metal film to which a conductor for external connection to be connected to an external wiring formed on printed circuit boards and which is covered, except a face for fitting the conductor for external connection, with a final protective insulating film and which is connected to an uppermost-layered wiring;

whereby a protective insulating film being formed below the final protective insulating film and on the protective insulating film is formed a trench for interconnect with a first barrier metal film, the uppermost-layered wiring, a second barrier metal film and the pad metal film imbedded from the bottom.

In the foregoing, it is preferable that the uppermost-layered wiring comprises a metal film composed mainly of copper.

Also, it is preferable that the conductor for external connection is composed of a bump-like conductor.

Also, it is preferable that the conductor for external connection is composed of a wire-like conductor.

Also, it is preferable that the bump-like conductor comprises solder or a metal composed mainly of gold.

A preferable mode is one wherein the wire-like conductor comprises aluminum or a metal composed of gold.

Also, a preferable mode is one wherein the pad metal film comprises a metal composed mainly of copper.

Also, a preferable mode is one wherein the pad metal film comprises a metal composed mainly of aluminum.

According to a third aspect of the present invention, there is provided a method for manufacturing a semiconductor device comprising the steps of:

forming a trench for interconnect on a protective insulating film provided on a semiconductor substrate;

forming metal films including, in order, a first barrier metal film, uppermost-layered wiring film, second barrier metal film and pad metal film on said protective insulating film including said trench for interconnect;

planarizing the protective insulating film by removing the first barrier metal film, uppermost-layered wiring film, second barrier metal film and the pad metal film from an upper face of the protective insulating film and the trench for interconnect;

patterning a final protective insulating film, after forming the final protective insulating film on the planarized protective insulating film, so that only the surface of the pad metal film is exposed; and fitting a conductor for external connection on the exposed area of the pad metal film.

According to a fourth aspect of the present invention, there is provided a method for manufacturing a semiconductor device comprising the steps of:

forming metal films including, in order, a first barrier metal film, uppermost-layered wiring film, second barrier metal film and pad metal film on a protective insulating film on a semiconductor substrate;

patterning the first barrier metal film, uppermost-layered wiring film, second barrier metal film and the pad metal film on the surface of the protective insulating film to desired shapes;

patterning a final protective insulating film, after forming the final protective insulating film on the patterned metal film, so that only the surface of the pad metal film is exposed; and fitting a conductor for external connection on the exposed surface of the pad metal film.

In the foregoing, a preferable mode is one wherein a metal film composed mainly of copper is used as the uppermost-layered wiring film.

Also, a preferable mode is one wherein a bump-like conductor is used as a conductor for external connection.

Also, a preferable mode is one wherein a wire-like conductor is used as a conductor for external connection.

It is preferable that a metal composed mainly of copper as the pad metal film.

Furthermore, it is preferable that a metal composed mainly of aluminum as the pad metal film.

BRIEF DESCRIPTION OF THE DRAWING

The above and other objects, advantages and features of the present invention will be more apparent from the following description taken in conjunction with the accompanying drawings, in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
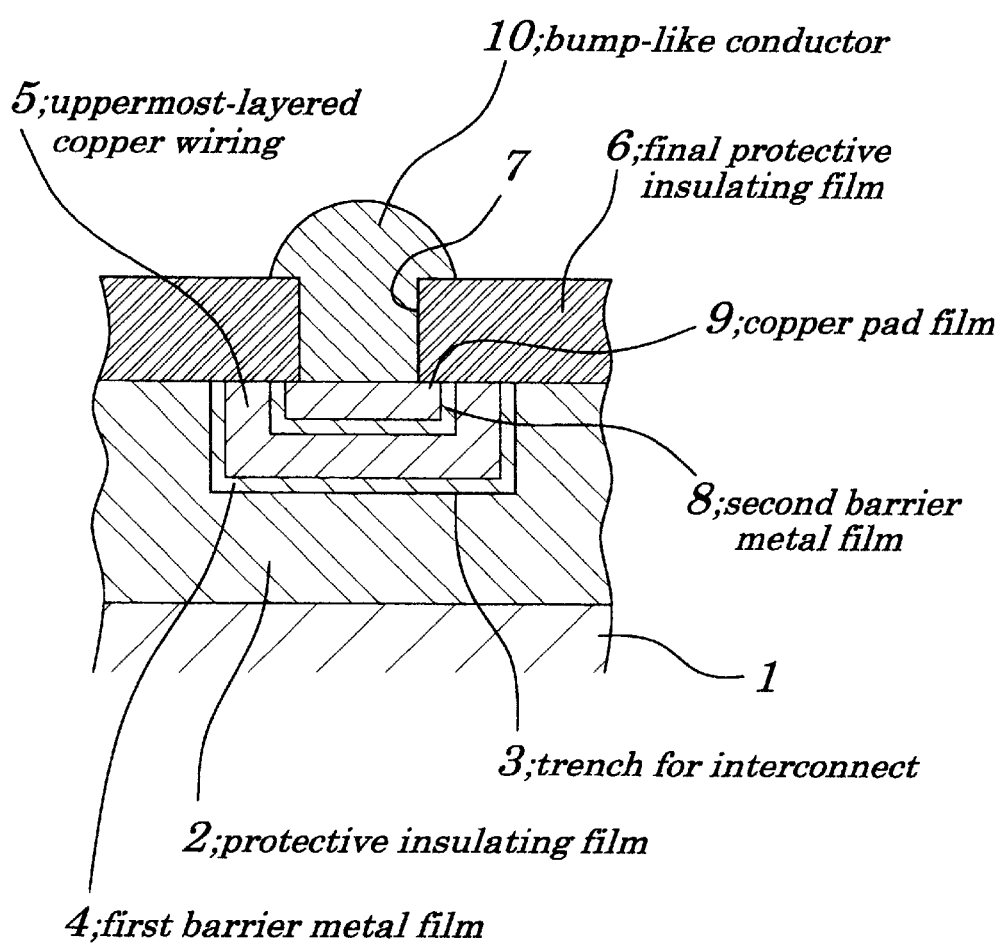
FIG. 1 is a cross-sectional view showing a semiconductor device according to a first embodiment of the present invention.

FIG. 1 is a cross-sectional view of a semiconductor device according to a first embodiment of the present invention. FIGS. 2A, 2B, 2C, 3A and 3B show a method for manufacturing the above semiconductor device in order of processes.

As depicted in FIG. 1, the semiconductor device is provided with a protective insulating film 2 consisting of an oxide film with a film thickness of 3 to 4 $\mu$m, formed on a semiconductor substrate 1 composed, for example, of silicon (Si), a trench for interconnect 3, with its diameter of about 50 $\mu$m and with its depth of about 2 $\mu$m, formed on the protective insulating film 2, and uppermost-layered copper wiring 5 formed, through a first barrier metal film 4 composed of titanium nitride with a thickness of about 50 nm, on the trench for interconnect. Moreover, a copper pad film 9 is formed, through a second barrier metal film 8 with a thickness of about 70 nm, approximately at the central area of the uppermost-layered copper wiring 5. The second barrier metal film 8 consists of stacked films, from its bottom in order, containing a titanium nitride film with a thickness of about 50 nm, a nickel film with a thickness of about 10 nm and a gold film with a thickness of about 10 nm.

On the protective insulating film 2, wirings for lower layers other than the uppermost-layered copper wiring is formed, which are connected to each other by a via plug (not shown).

The protective insulating film 2 is covered with a final protective insulating film 6 composed of an oxide film or the like. The final protective insulating film 6 is provided with a contact hole 7 which makes a central area of the copper pad film 9 exposed. A bump-like conductor 10 composed of solder is fitted to the copper pad film 9 through the contact hole 7. The bump-like conductor 10 is formed by a plating or deposition method, or the like. At this point, the bump-like conductor 10 is formed so that it grows from the surface of the copper pad film 9, by using a self alignment process and, as a result, its position is exactly controlled. Furthermore, to fabricate the bump-like conductor 10, gold or a metal mainly composed of gold and silicon or the like may be used, instead of the solder.

By referring to FIGS. 2A to 2C, 2D and 2E, a method for manufacturing the semiconductor device according to the embodiment.

Figure 2A:
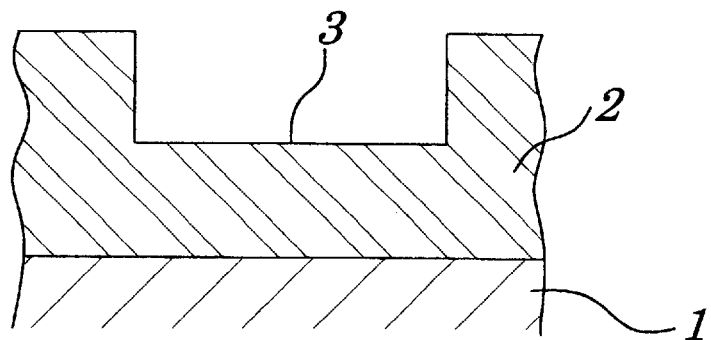
FIGS. 2A, 2B and 2C are process diagrams, in order of processes, of a method for manufacturing the above semiconductor device.

First, as shown in FIG. 2A, the trench for interconnect 3, with its diameter 50 $\mu$m and its depth of about 2 $\mu$m, is formed on the protective insulating film 2, formed on the semiconductor substrate 1 and composed of an oxide film with a thickness of 3 to 4 $\mu$m, by using lithography technology or the like. Wiring for the lower layers other than the uppermost-layered copper wiring is formed on the protective insulating film 2.

Figure 2B:
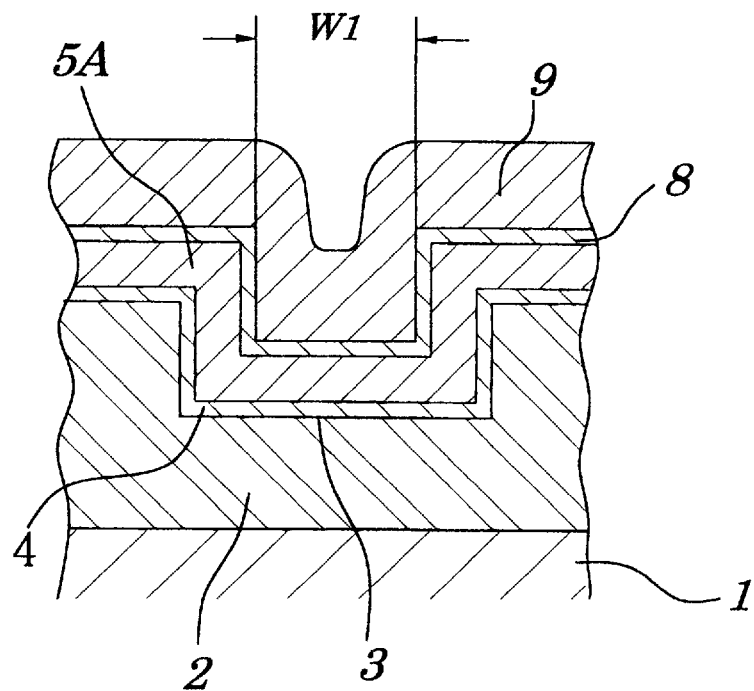

Next, as depicted in FIG. 2B, on the protective insulating film 2 containing the trench for interconnect 3, are formed the first barrier metal film 4 composed of a titanium nitride film with a thickness of 50 nm, the uppermost-layered copper film 5A with a thickness of about 1 $\mu$m, the second barrier metal film 8 composed of the stacked film containing, from its bottom in order, the titanium nitride film with a thickness of about 50 nm, a nickel film with a thickness of about 10 nm and a gold film with a thickness of about 10 nm, and the copper pad film 9, in turn, by a sputtering method or the like. At this point, the copper pad film 9 in the trench for interconnect 3 is formed so that the width of the copper pad film (W1) is 47 to 48 $\mu$m.

Figure 2C:
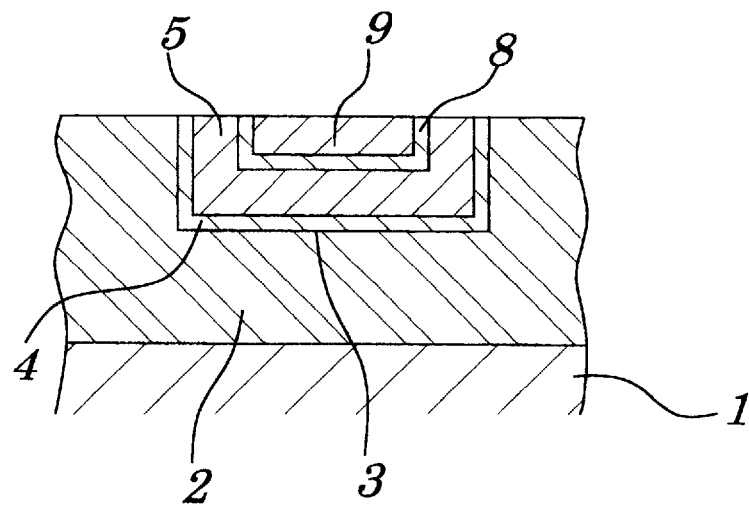

Next, as shown in FIG. 2C, the protective insulating film 2 is planarized by removing the first barrier metal film 4, uppermost-layered copper film 5A, second barrier metal film 8 and copper pad film 9 by a CMP (Chemical Mechanical Polishing) method, from the surface of the protective insulating film 2 and from the upper face of the wiring for interconnect 3, and, as a result, the uppermost layered copper wiring 5 is formed. Thus, the uppermost-layered is used as trench interconnection, providing good contact among films.

Figure 3A:
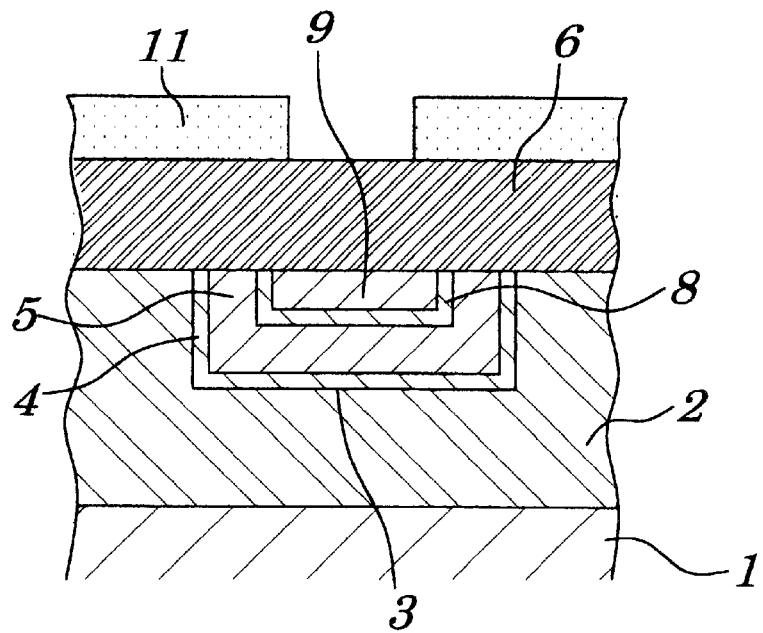
FIGS. 3A and 3B are process diagrams, in order of processes, of a method for manufacturing the semiconductor device.

Then, as shown in FIG. 3A, on the protective insulating film 2, a first barrier metal film 4, an uppermost-layered copper wiring 5, a second barrier metal film 8 and a copper pad film 9 is formed the final protective insulating film 6 composed of stacked films containing, from its bottom in order, an oxide film with a thickness of about 800 nm, a nitriding film with a thickness of 100 nm and a polyimide film with a thickness of about 5 $\mu$m. The final protective insulating film 6 may be constructed by a polyimide film being excellent in close contact. A resist film 11 is formed in a desired region of the final protective insulating film 6.

Figure 3B:
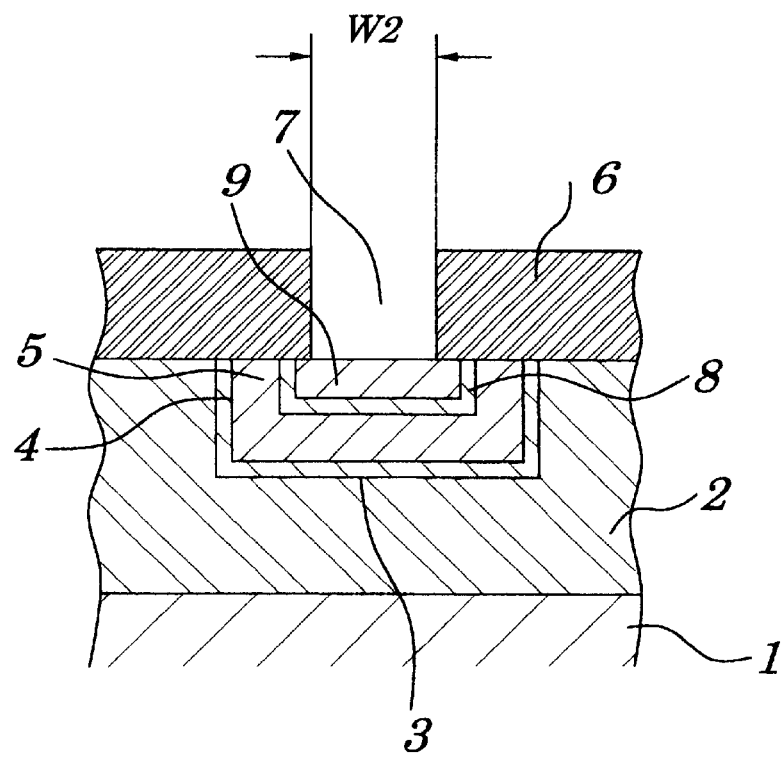

Next, as shown in FIG. 3B, etching is performed on the final protective insulating film 6 using the resist film 11 as a mask, forming a contact hole 7 with a thickness of W2. The contact hole 7 is formed so that the thickness W2 of the contact hole 7 is smaller than the thickness W1 of the copper pad film 9 in the trench for interconnect 3 and is about 40 $\mu$m. The semiconductor device as shown in FIG. 1 by forming a bump-like conductor 10 composed of solder through the contact hole 7 by a plating method, the semiconductor device shown in FIG. 1 is produced.

When plating with solder is made to form the bump-like conductor 10, because solder is grown from the surface of the copper pad film 9 exposed through the contact hole 7 defined by the thickness of W2, the bump-like conductor 10 is exactly controlled by self alignment process. Moreover, the bump-like conductor 10 may be formed by utilizing a deposition method. After the vapor deposition of solder on the whole final protective insulating film 6 to form a soldering film, patterning is performed so that the soldering film is left in the contact hole 7 and its peripheral region. Next, by thermally treating the soldering film at a temperature more than a melting point of solder, the remaining soldering film is melt and the melt soldering film is collected at a surrounding position centering the contact hole 7, resulting in the formation of the bump-like conductor 10.

Thus, according to this embodiment, because the copper pad film 9 is formed on the final protective insulating film 6 exposed through the contact hole 7 after the preliminary formation of the trench for interconnect 3 on the protective insulating film 2 and also the formation of the first barrier metal film 3, the uppermost-layered copper wiring 5, the second barrier metal film 8 and the copper film 9, unlike in the case of the conventional method, it is not necessary that the patterning is not performed until the second barrier metal film and copper pad film are formed on the final protective insulating film. Accordingly, the number of processes can be reduced.

Also, in the semiconductor device according to the embodiment, since the bump-like conductor is formed by self alignment process, the position of forming the bump-conductor can be exactly controlled.

Thus, the copper pad film used to fit a conductor, composed of the bump-like conductor, for external connection can be formed by the reduced number of processes.

Second Embodiment

Figure 4:
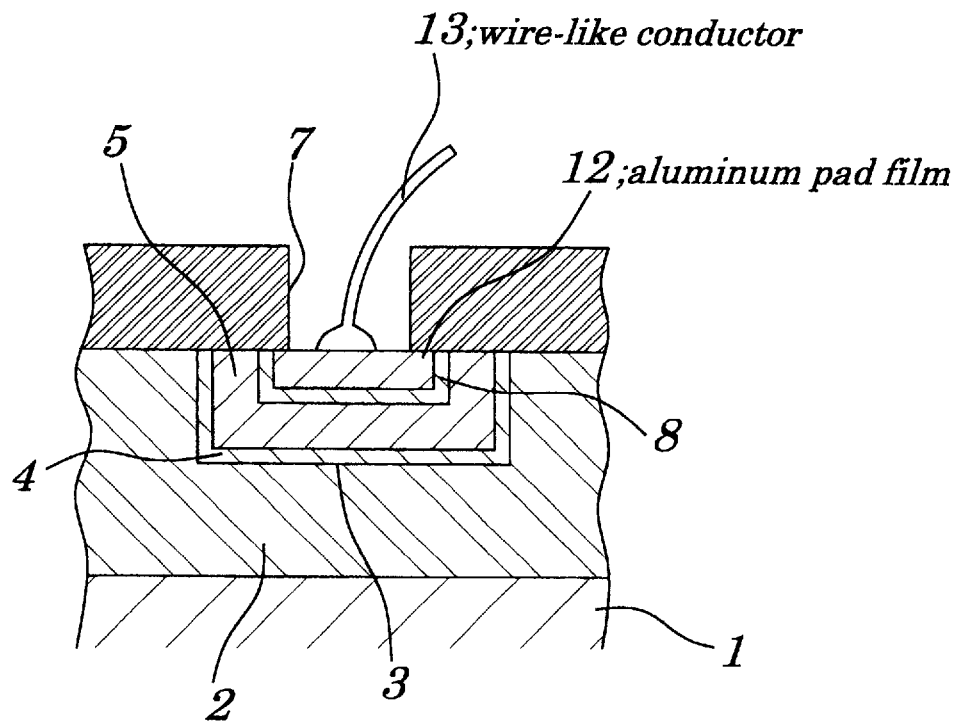
FIG. 4 is a cross-sectional view showing a semiconductor device according to a second embodiment of the present invention.

FIG. 4 is a cross-sectional view showing a semiconductor device according to a second embodiment of the present invention. The configuration according to the second embodiment is different, as shown in FIG. 4, from that of the first embodiment in that an aluminum pad film is used instead of the copper pad film and a wire-like conductor composed of aluminum is used instead of the bump-like conductor as an conductor for external connection.

As is apparent when compared with the configuration shown in FIG. 1 according to the first embodiment, in this embodiment as shown in FIG. 4, the wire-like conductor 13 made from aluminum is fitted to the aluminum pad film 12. Accordingly, a connection between aluminum and aluminum is achieved, thus avoiding the contact between aluminum and copper, which may cause the production of deleterious alloy and achieving a good contact. The wire-like conductor 13 may be made, instead of aluminum, from a metal mainly composed of, in addition to aluminum, other metals including silicone, copper and the like. Moreover, instead of aluminum, gold or a metal mainly composed of gold and additionally silicone and the like. The gold or the metal mainly composed of gold is able to establish a good contact with the aluminum pad film 12.

To fabricate the semiconductor device according to this embodiment, in the process shown in FIG. 2B, the aluminum pad film is formed instead of the copper pad film 9, and after the process shown in FIG. 3B, the wire-like conductor made from aluminum is fitted to the aluminum pad film.

The same reference numbers in FIG. 4 designate corresponding parts shown in the first embodiment and the description is omitted.

Thus, in this embodiment, the same effects can be obtained that have been achieved in the first embodiment.

Third Embodiment

Figure 5:
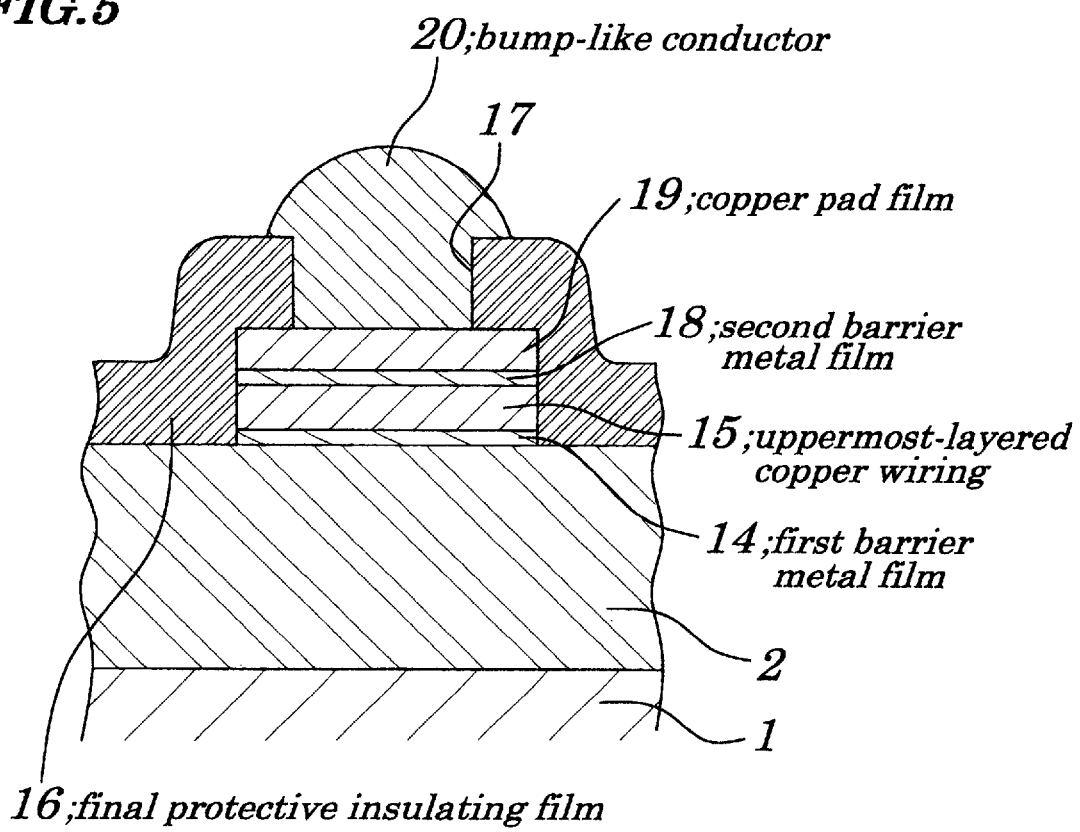
FIG. 5 is a cross-sectional view showing a semiconductor device according to a third embodiment of the present invention.

FIG. 5 is a cross-sectional view of a semiconductor device according to a third embodiment of the present invention. The configuration according to the third embodiment is different, as shown in FIG. 5, from that of the first embodiment in that the uppermost-layered copper wiring is formed not on the trench for interconnect over the protective insulating film but on the protective insulating film.

As is apparent when compared with the configuration shown in FIG. 1 according to the first embodiment, in this embodiment as shown in FIG. 5, on a protective insulating film 2 composed of an oxide film with a thickness of 3 to 4 $\mu$m is formed an uppermost-layered copper wiring 15 through a first barrier metal film 14 composed of a titanium nitride film with a thickness of about 50 nm and, on the uppermost-layered copper wiring 15 is formed a copper pad film 19 through a second barrier metal film 18 with a thickness of about 70 nm. The second barrier metal film 18 is composed of stacked layers containing, for example, a titanium nitride film with a thickness of about 50 nm, a nickel nitride film with a thickness of about 10 nm and a gold film with a thickness of about 10 nm, from its bottom in order.

The protective insulating film 2 is covered with a final protective insulating film 16 composed of an oxide film with a thickness of about 5 $\mu$m. The final protective insulating film 16 is provided with a contact hole 17 which makes a central area of the copper pad film 9 exposed. A bump-like conductor 20 composed of solder is fitted through the contact hole 17 to the copper pad film 19.

Referring to FIGS. 6A, 6B, 7A and 7B, a method for manufacturing the semiconductor device of this embodiment, in order of processes, is described.

Figure 6A:
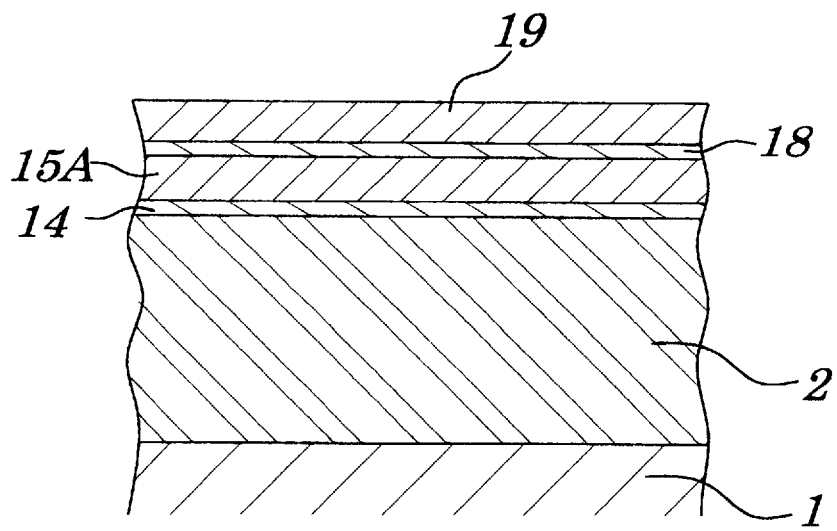
FIGS. 6A and 6B are process diagrams, in order of processes, showing a method for manufacturing the semiconductor device.

First, as shown in FIG. 6A, on the protective insulating film 2, formed on a semiconductor substrate 1, composed of an oxide film with a thickness of 3 to 4 µm, are formed, by sputtering methods or the like, the first barrier metal film 14 composed of a titanium nitride film with a thickness of about 50 nm, an uppermost-layered copper wiring film 15A with a thickness of about 1 µm, the second barrier metal film 18 composed of stacked layers containing, from its bottom in order, a titanium nitride film with a thickness of about 50 nm, a nickel film with a thickness of about 10 nm and a gold film with a thickness of about 10 nm, and the copper pad film 19 with a thickness of about 1.5 µm, sequentially.

Figure 6B:
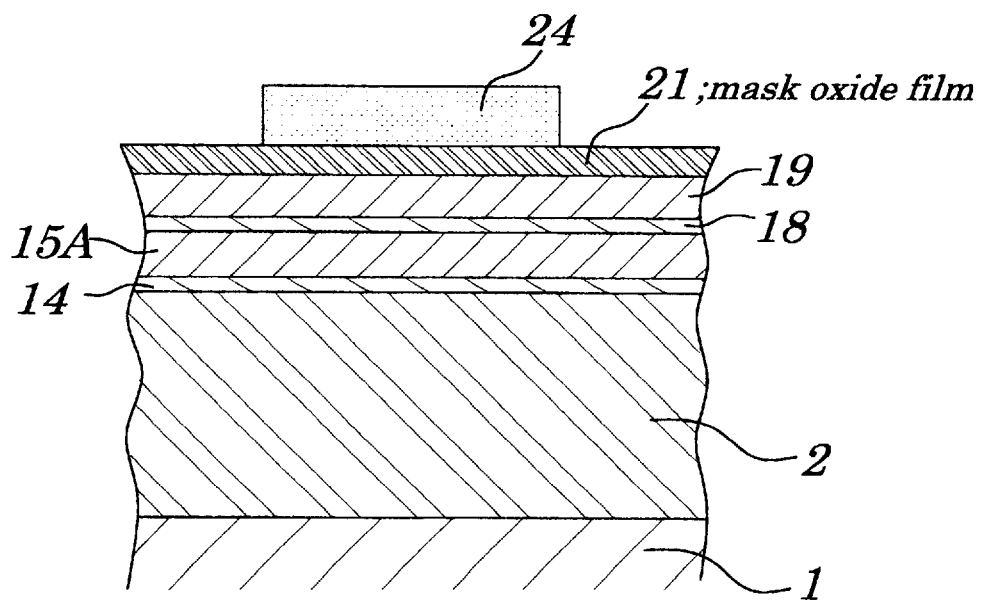

Next, as shown in FIG. 6B, after a mask oxide film 21 with a thickness of about 300 nm is formed by sputtering or the like on the copper pad film 19, a resist film 24 is formed on this mask oxide film 21. This mask oxide film 21 is used to protect the stacked layers while etching is made.

Figure 7A:
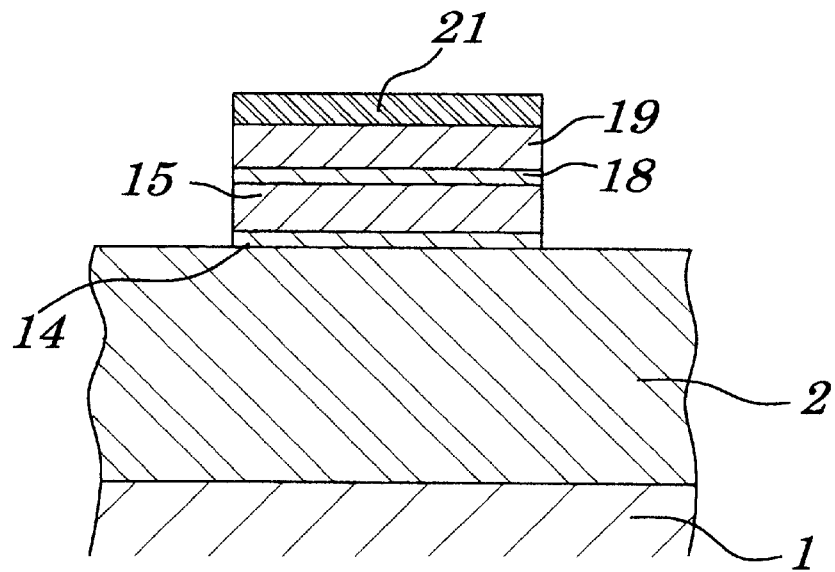
FIGS. 7A and 7B are process diagrams, in order of processes, showing a method for manufacturing the semiconductor device.

As shown in FIG. 7A, after dry etching is performed using the resist film 24 as a mask, patterning is performed on the first barrier metal film 14, the uppermost-layered copper wiring film 15A, the second barrier metal film 18 and the copper pad film 19 so as to obtain a desired shape and to form the uppermost-layered copper wiring 15. This patterning is performed continuously by etching. At this point, the mask insulating film 21 is left as it is. After patterning is made only on the mask oxide film 21 using the resist film 24 as a mask, the resist film 24 is removed, and by using the patterned mask oxide film 21 as a mask, the patterning is made on the first barrier metal film 14, the uppermost-layered copper wiring film 15A, the second barrier metal film 18 and the copper pad film 19 to desired shapes.

Figure 7B:
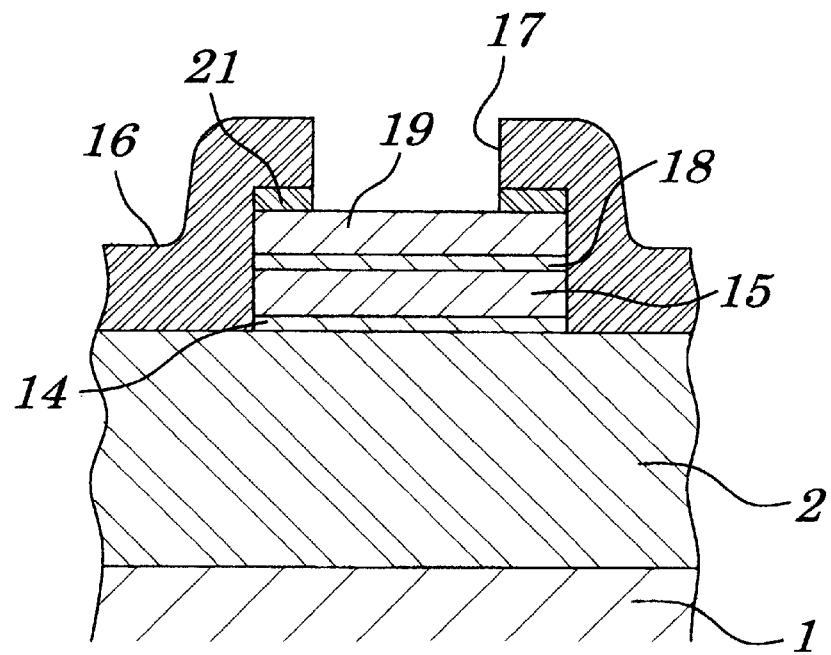

Next, as shown in FIG. 7B, by using sputtering or the like, on the protective insulating film 12, the first barrier metal film 14, At the uppermost-layered copper wiring film 15, the second barrier metal film 18 and the copper pad film 19 is formed the final protective insulating film 16. After that, using a resist film (not shown) as a mask, dry etching is made and the contact hole 17 is formed with a partial area of the copper pad film 19 being exposed. In this case, if the mask oxide film 21 had been left by the previous process, the etching is made on this as well. According to this embodiment, on the protective insulating film 2 is formed stacked wiring containing the uppermost-layered copper wiring 15 by one time etching process, which enables the number of processes to be reduced accordingly.

To fabricate the semiconductor device in FIG. 5, the bump-like conductor 10 composed of solder is fitted through the contact hole 17 by using a plating method.

Thus, in this embodiment, the same effects can be obtained that have been achieved in the first embodiment.

Fourth Embodiment

Figure 8:
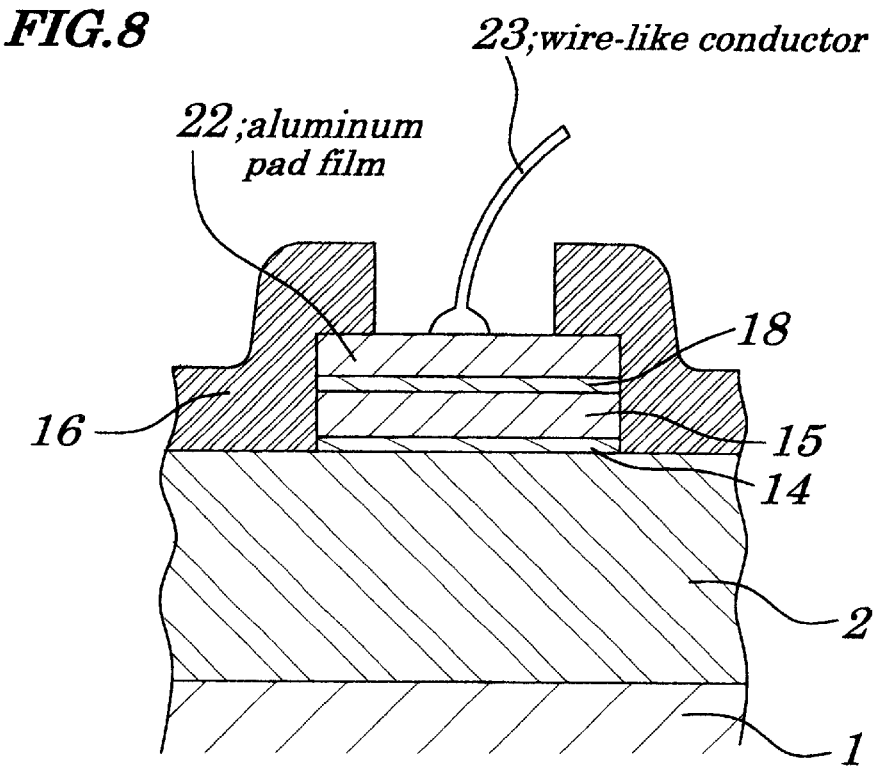
FIG. 8 is a cross-sectional view showing a semiconductor device according to a fourth embodiment of the present invention.
Figure 9:
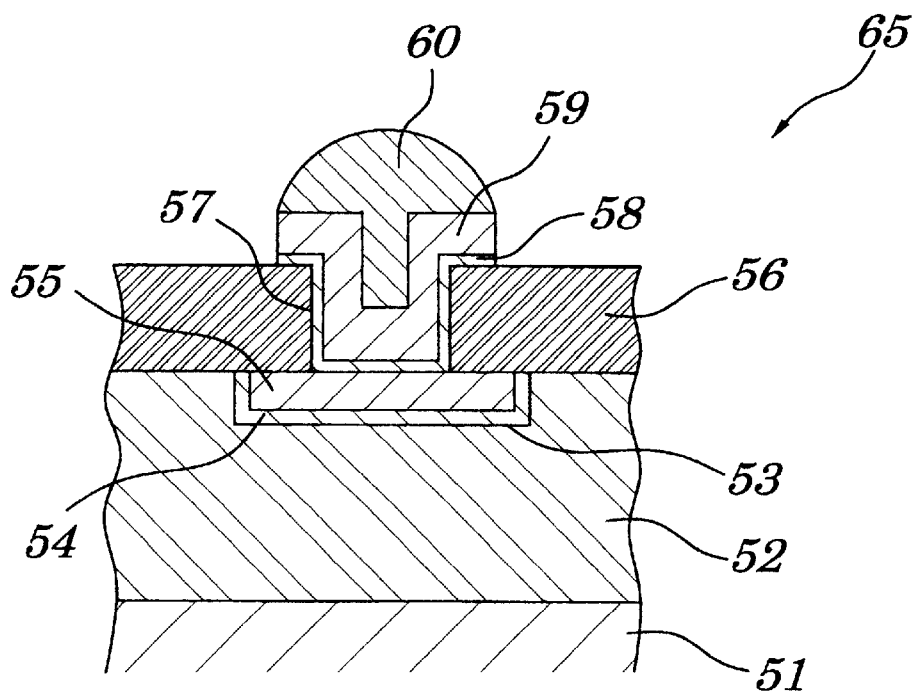
FIG. 9 is a cross-sectional view showing a conventional semiconductor device.
Figure 10A:
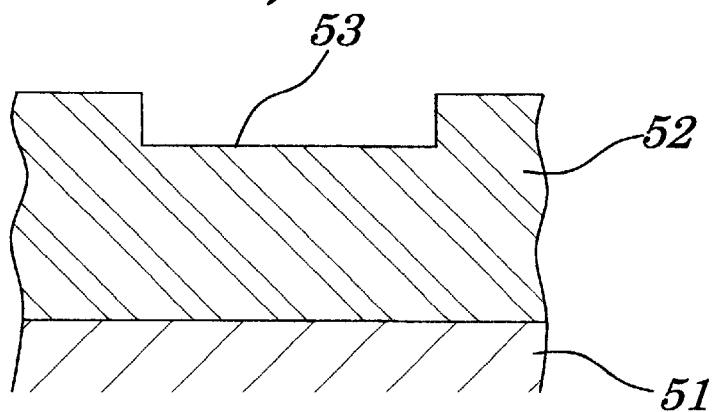
FIGS. 10A, 10B and 10C are process diagrams, in order of processes, of a method for manufacturing the semiconductor device.
Figure 10B:
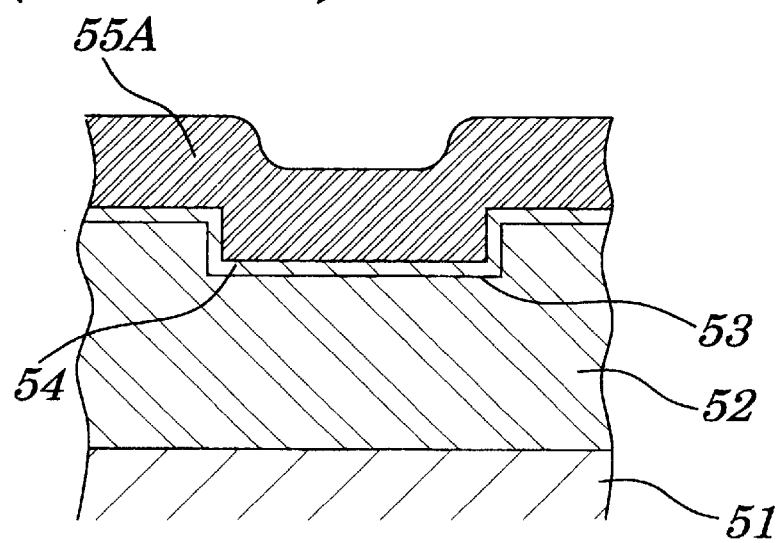
Figure 10C:
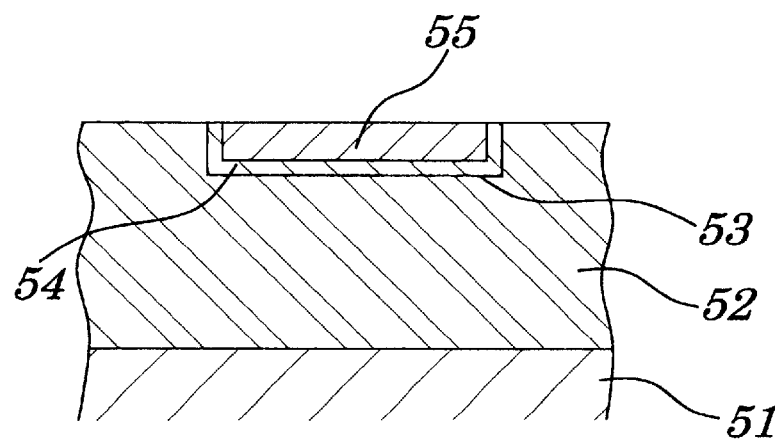
Figure 11A:
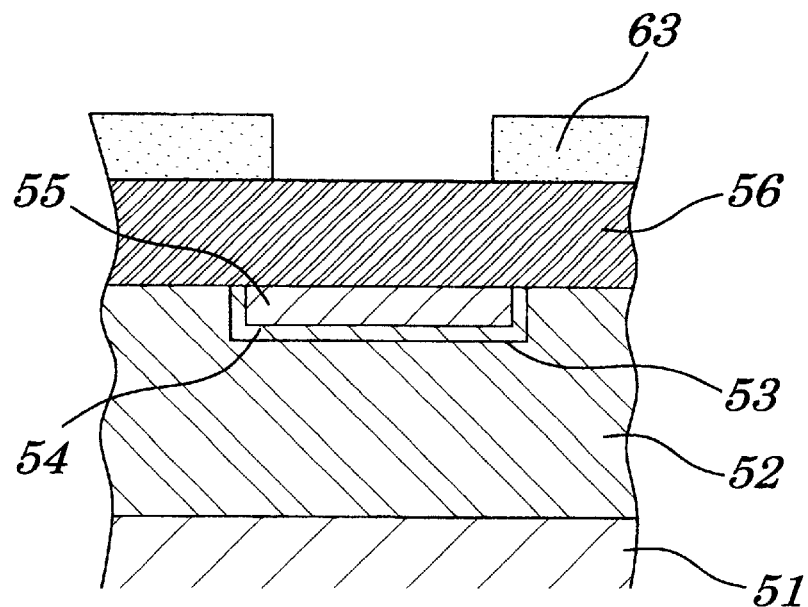
FIGS. 11A and 11B are process diagrams, in order of processes, of a method for manufacturing the semiconductor device.
Figure 11B:
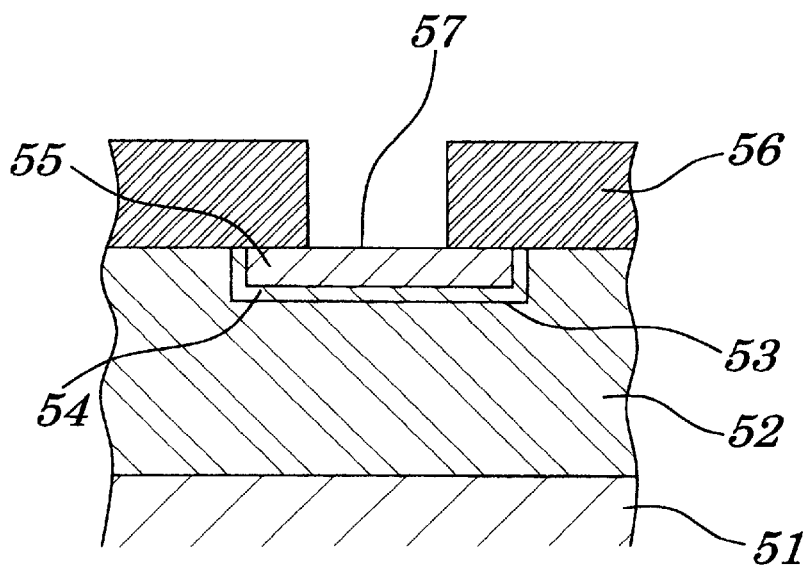
Figure 12A:
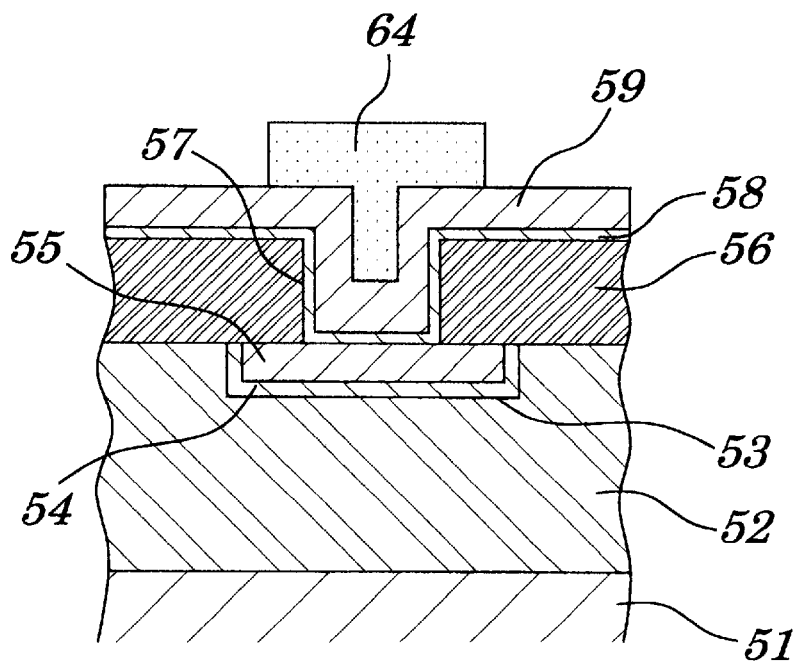
FIGS. 12A and 12B are process diagrams, in order of processes, of a method for manufacturing the semiconductor device.
Figure 12B:
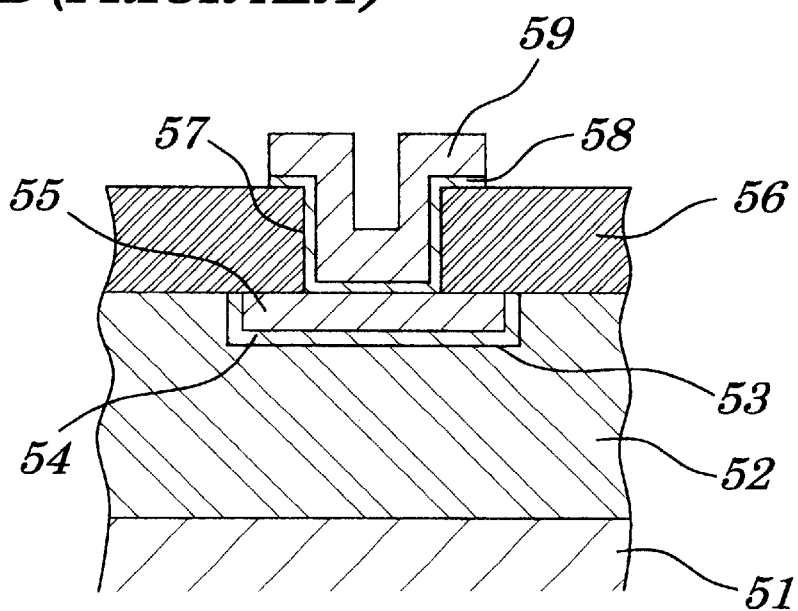
Figure 13:
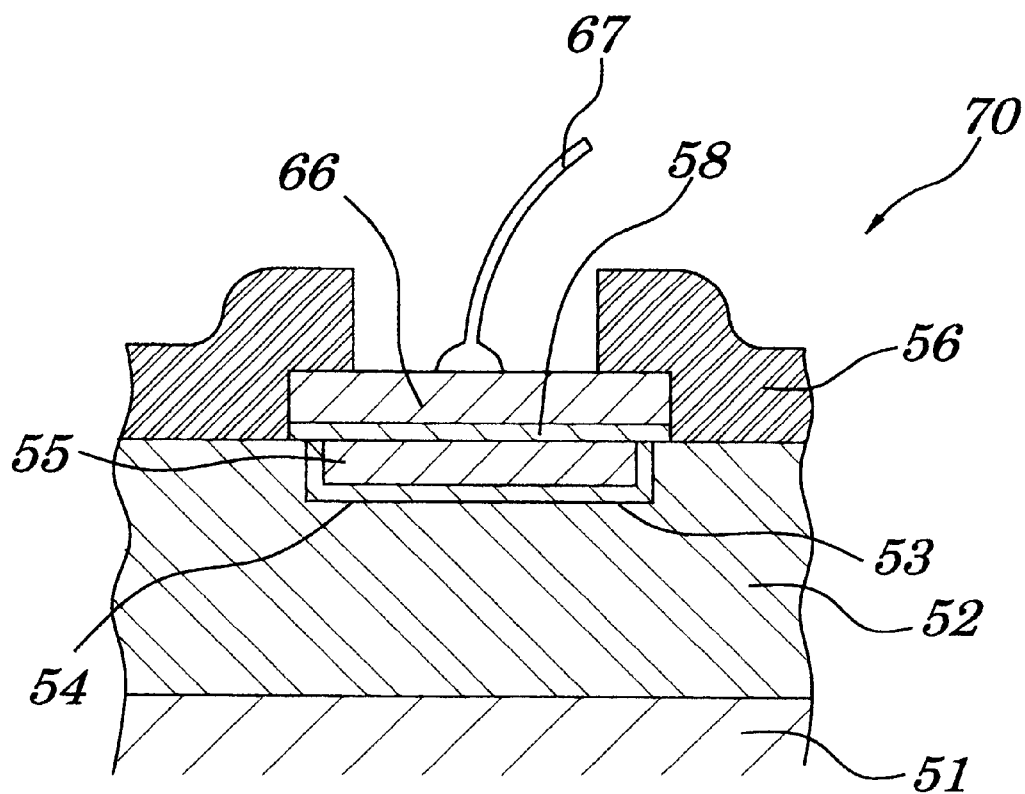
FIG. 13 is a cross-sectional view showing a conventional semiconductor device.
Figure 14A:
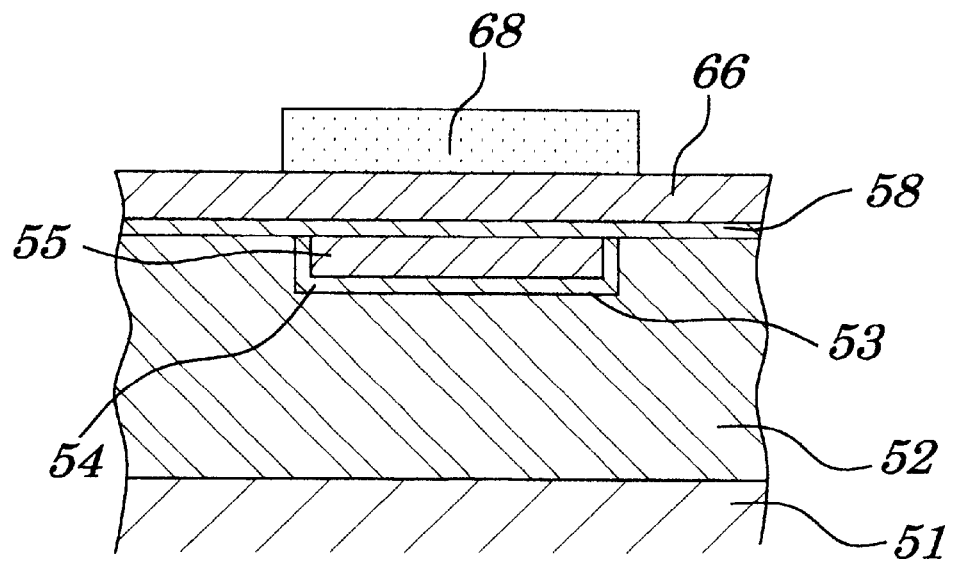
FIGS. 14A and 14B are process diagrams, in order of processes, showing a method for manufacturing the above semiconductor device.
Figure 14B:
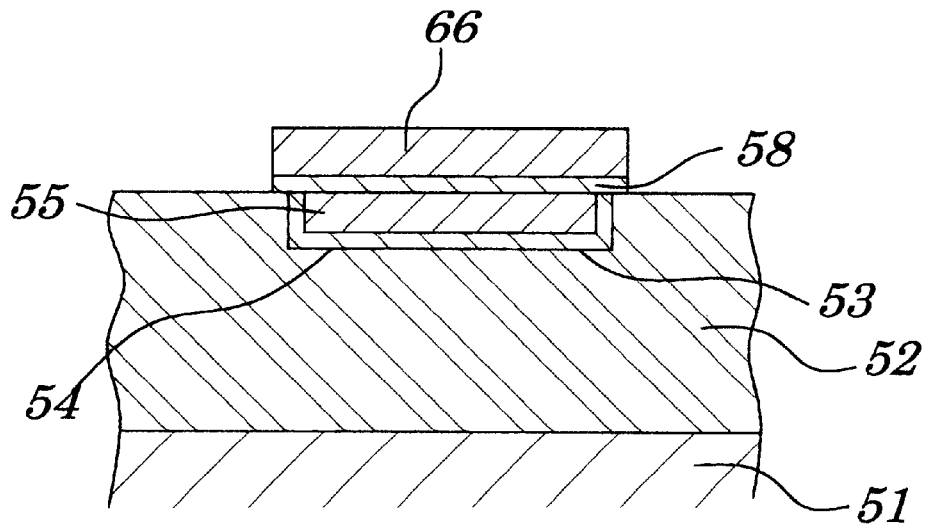
Figure 15A:
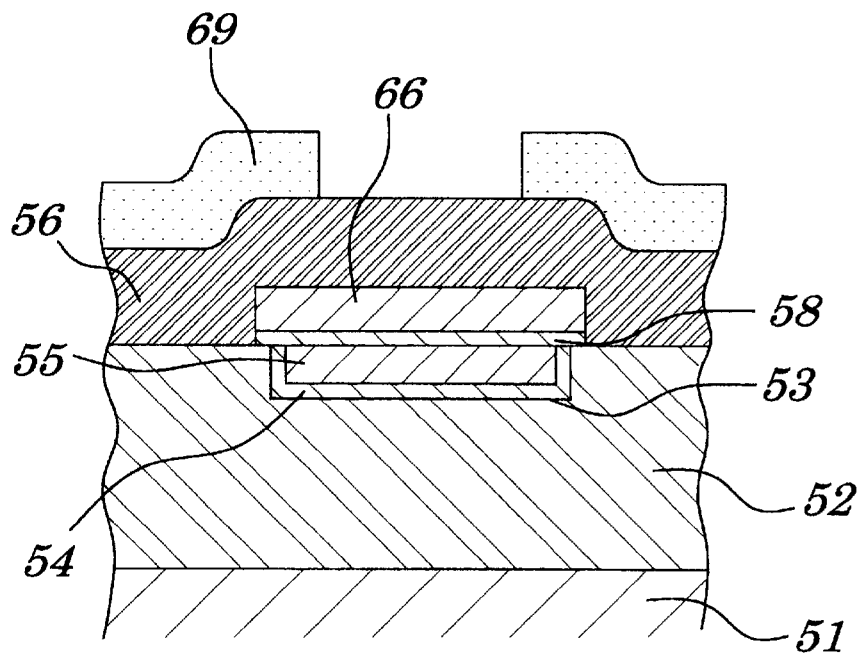
FIGS. 15A and 15B are process diagrams, in order of processes, showing a method for manufacturing the above semiconductor device.
Figure 15B:
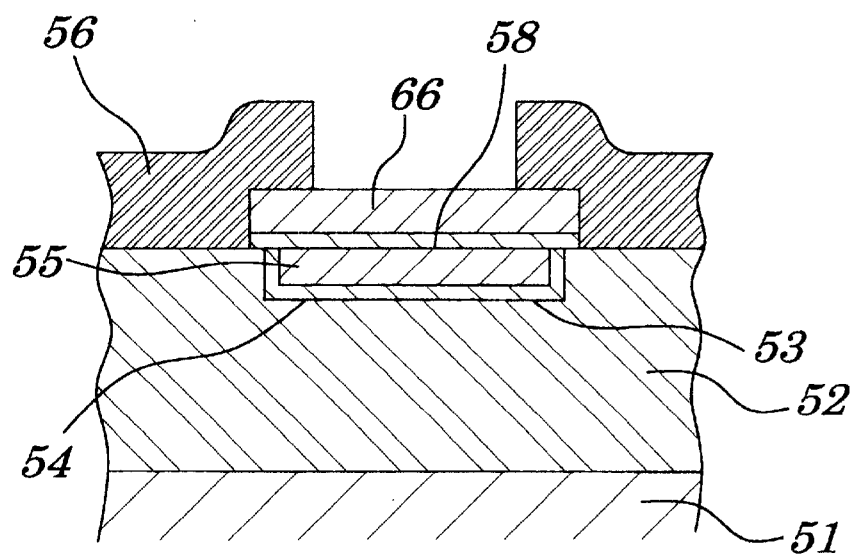
Figure 16:
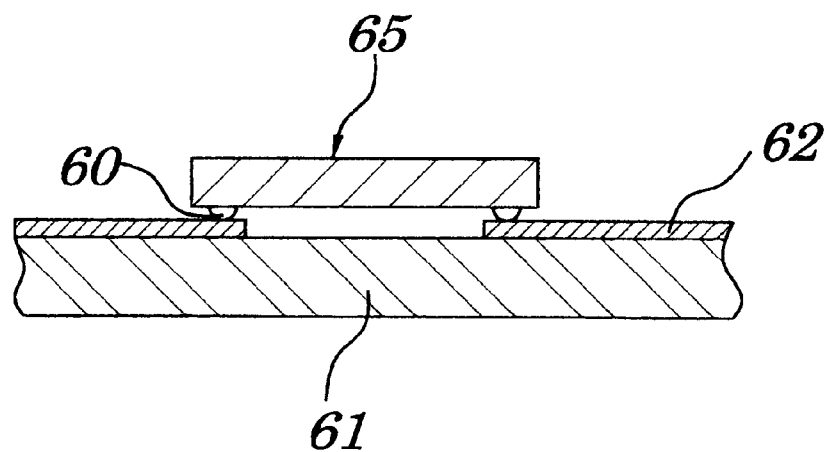
FIG. 16 is a cross-sectional view showing a mounting structure of a conventional semiconductor device.
Figure 17:
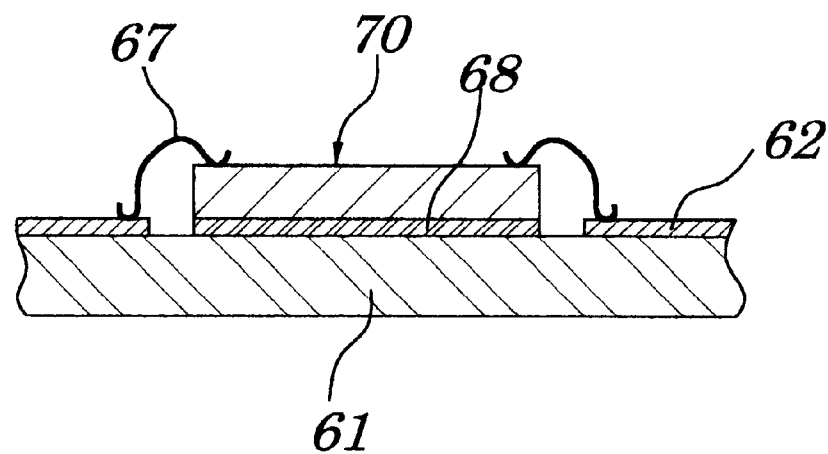
FIG. 17 is a cross-sectional view showing a mounting structure of the conventional semiconductor device.

FIG. 8 is a cross-sectional view showing a semiconductor device according to a fourth embodiment of the present invention.

The configuration according to the third embodiment is different, as shown in FIG. 8, from that of the third embodiment in that an aluminum pad film is used instead of the copper pad film and in that a wire-like conductor is used, instead of the bump-like conductor, as a conductor for external connection.

As is apparent when compared with the fourth embodiment in FIG. 5, in this embodiment, a wire-like conductor 23 composed of aluminum is fitted to the aluminum pad film 22.

To fabricate the semiconductor device of this embodiment, the aluminum pad film is formed instead of the copper pad film 19 and, after the processes shown in FIG. 7B, a wire-like conductor composed of aluminum is connected to the aluminum pad film.

Thus, in this embodiment, the same effects can be obtained that have been achieved in the first embodiment.

It is apparent that the present invention is not limited to the above embodiments but may be changed and modified without departing from the scope and spirit of the invention. For example, the copper used for the uppermost-copper wiring or the copper pad film may contain other metals such as titanium, aluminum or the like. The aluminum used for the aluminum pad film may contain other metals such as silicone, copper and the like. That is, metal films mainly containing copper can be used as a copper wiring and metal films mainly containing aluminum can be used as an aluminum wiring.

Moreover, the first and second barrier metal films can use a single metal such as tantalum, molybdenum, tungsten or the like, or a nitriding film using such metals. The above barrier metals also can use stacked films obtained by combining a single metal with a nitriding film. For example, stacked films composed of a tantalum nitride film, nickel film and gold film or stacked films composed of a nickel film or gold film can be utilized.

The thickness of metal films or method for manufacturing described above shows only one example and can be modified depending on applications or purposes. The deposition method used therein may contain not only sputtering methods but also CVD (Chemical Vapor Deposition), plasma CVD method or high density plasma CVD methods. As the insulating film, not only an oxide film but also BSG (Boro-Silicate Glass), PSG (Phospho-Silicate Glass) and BPSG (Boro-Phospho-Silicate Glass) films can be used. Furthermore, the thickness of films of each metal film, insulating film and the like is only one of examples and can be changed depending on applications or purposes.

As described above, according to the method of the present invention, because the semiconductor device is so configured that the formation of the final protective insulating film with the pad film partially exposed after the completion of the preliminary formation of the first barrier metal film, uppermost copper wiring, second barrier metal film and pad film on the trench for interconnect of the protective insulating film, the production process can be reduced.

Moreover, according to the present invention, the bump-like conductor, when fitted to the pad metal film, is formed by self alignment process, thus allowing its forming position to be exactly controlled. Also, a good contact can be obtained by fitting the wire-like conductor to the pad metal film.

Accordingly, the pad metal film used to fit the conductor for external connection composed of the bump-like or wire-like conductor can be formed by reduced numbers of the processes.

Finally, the present application claims the priority based on Japanese Patent Application No. Hei10-263663 filed on Sep. 17, 1998, which is herein incorporated by reference.

What is claimed is:

1. A semiconductor device comprising:
   a plurality of individual devices disposed upon a semiconductor substrate and electrically interconnected in a predetermined arrangement by a plurality of conductive interconnect lines disposed in a plurality of interconnect layers and interconnected from one interconnect layer to another by a plurality of interlayer contacts communicating through a plurality of interlayer insulating layers, one of the plurality of interconnect layers being located at an uppermost position with respect to the semiconductor substrate;

the uppermost interconnect layer being disposed in a trench in an uppermost one of the plurality of interlayer insulating layers, and covered by a protective insulating layer containing a plurality of contact holes disposed to make electrical contact from the interconnect layer to an external conductor line, the uppermost interlayer insulating film having a substantially flat top surface;

the uppermost interconnect layer including from the bottom in order a first barrier layer comprised of a first conductive material disposed in contact with the uppermost insulating layer, a first conductor layer comprised of a second conductive material disposed in contact with the first barrier layer and not in contact with the uppermost insulating layer, a second barrier layer comprised of a third conductive material disposed in contact with the first conductor layer and not in contact with the uppermost insulating layer, and an external conductor line contact pad layer comprised of a fourth conductive material disposed in contact with the second barrier layer and not in contact with the first conductor layer;

wherein an uppermost portion of each of the first barrier layer, the first conductor layer, the second barrier layer and the external conductor line contact pad layer are substantially in the same plane as the substantially flat top surface of the uppermost interlayer insulating film.

2. The semiconductor device according to claim 1, wherein the protective insulating layer covers at least a portion of the external conductor line contact pad layer, and substantially all of the uppermost portion of each of the first barrier layer, the first conductor layer and the second barrier layer, such that no substantial portion of the first barrier layer, the first conductor layer and the second barrier layer is exposed to the external environment.

3. The semiconductor device according to claim 1, wherein the second and fourth conductive materials of the first conductor layer and the contact pad respectively comprise a copper alloy material.

4. The semiconductor device according to claim 1, wherein the first conductive material of the first barrier layer comprises a titanium nitride material.

5. The semiconductor device according to claim 1, wherein the third conductive material of the second barrier layer comprises a stacked film of titanium nitride material, nickel and gold.

6. The semiconductor device according to claim 1, wherein further the external conductor line comprises a bump-like conductor.

7. The semiconductor device according to claim 1, wherein further the external conductor line comprises a wire-like conductor.

8. A semiconductor device comprising:

a plurality of individual devices disposed upon a semiconductor substrate and electrically interconnected in a predetermined arrangement by a plurality of conductive interconnect lines disposed in a plurality of interlayer insulating layers and interconnected from one interconnect layer to another by a plurality of interlayer contacts communicating through a plurality of interlayer insulating layers, one of the plurality of interconnect layers being located at an uppermost position with respect to the semiconductor substrate;

the uppermost interconnect layer including from the bottom in order a first barrier layer comprised of a first conductive material disposed in contact with a substantially flat uppermost surface of the uppermost insulating layer, a first conductor layer comprised of a second conductive material disposed in contact with the first barrier layer and not in contact with the uppermost insulating layer, a second barrier layer comprised of a third conductive material disposed in contact with the first conductor layer and not in contact with the uppermost insulating layer, an external conductor line contact pad layer comprised of a fourth conductive material disposed in contact with the second barrier layer and not in contact with the first conductor layer, and a mask oxide film;

wherein each of the first barrier layer, the first conductor layer, the second barrier layer, the contact pad layer and the mask oxide film have side surfaces that are in a stack in substantially the same horizontal locations; and substantially all of the side surfaces are in contact with a protective insulating film disposed upon the uppermost interlayer insulating layer and the mask oxide, wherein the protective insulating film and mask oxide include a plurality of contact holes disposed to make electrical contact from the pad layer to an external conductor line.

9. The semiconductor device according to claim 8, wherein the protective insulating layer covers at least a portion of the masking oxide layer and the external conductor line contact pad layer, and substantially all of the first barrier layer, the first conductor layer and the second barrier layer, such that no substantial portion of the first barrier layer, the first conductor layer and the second barrier layer is exposed to the external environment.

10. The semiconductor device according to claim 8, wherein the second and fourth conductive materials of the first conductor layer and the contact pad respectively comprise a copper alloy material and an aluminum alloy material.

11. The semiconductor device according to claim 8, wherein the first conductive material of the first barrier layer comprises a titanium nitride material.

12. The semiconductor device according to claim 8, wherein the third conductive material of the second barrier layer comprises a stacked film of titanium nitride material, nickel and gold.

13. The semiconductor device according to claim 8, wherein further the external conductor line comprises a bump-like conductor.

14. The semiconductor device according to claim 8, wherein further the external conductor line comprises a wire-like conductor.

\* \* \* \* \*